United States Patent
Shakuda et al.

[11] Patent Number: 6,107,648
[45] Date of Patent: Aug. 22, 2000

[54] SEMICONDUCTOR LIGHT EMITTING DEVICE HAVING A STRUCTURE WHICH RELIEVES LATTICE MISMATCH

[75] Inventors: Yukio Shakuda; Shunji Nakata; Yukio Matsumoto, all of Kyoto, Japan

[73] Assignee: Rohm Co., Ltd., Kyoto, Japan

[21] Appl. No.: 09/041,694

[22] Filed: Mar. 13, 1998

[30] Foreign Application Priority Data

Mar. 13, 1997 [JP] Japan .................................... 9-059217
Mar. 13, 1997 [JP] Japan .................................... 9-059218
Mar. 13, 1997 [JP] Japan .................................... 9-059220

[51] Int. Cl.$^7$ .................................................. H01L 33/00
[52] U.S. Cl. .......................... 257/103; 257/96; 257/97; 257/190; 257/191
[58] Field of Search ........................... 257/94, 96, 103, 257/97, 190, 191; 372/45, 46

[56] References Cited

U.S. PATENT DOCUMENTS 5,008,718   4/1991   Fletcher et al. ........................ 257/96
5,661,742   8/1997   Huang et al. ........................... 257/94
5,869,849   2/1999   Jou et al. ............................... 257/96

*Primary Examiner*—Minh Loan Tran
*Attorney, Agent, or Firm*—Arent Fox Kintner Plotkin Kahn

[57] ABSTRACT

A light emitting layer forming portion is formed of an AlGaInP-based compound semiconductor and having an n-type layer and a p-type layer to form a light emitting layer on the substrate. A large bandgap energy semiconductor layer is provided on a surface of the light emitting layer forming portion to constitute a window layer. A buffer layer is interposed between the light emitting layer forming portion and the large bandgap energy semiconductor layer to relieve lattice mismatch of between the light emitting layer forming portion and the large bandgap energy semiconductor layer. The interposition of this buffer layer provides a light emitting device that is high in light emitting efficiency and excellent in electrical characteristics without degrading the film property of the window layer.

9 Claims, 5 Drawing Sheets

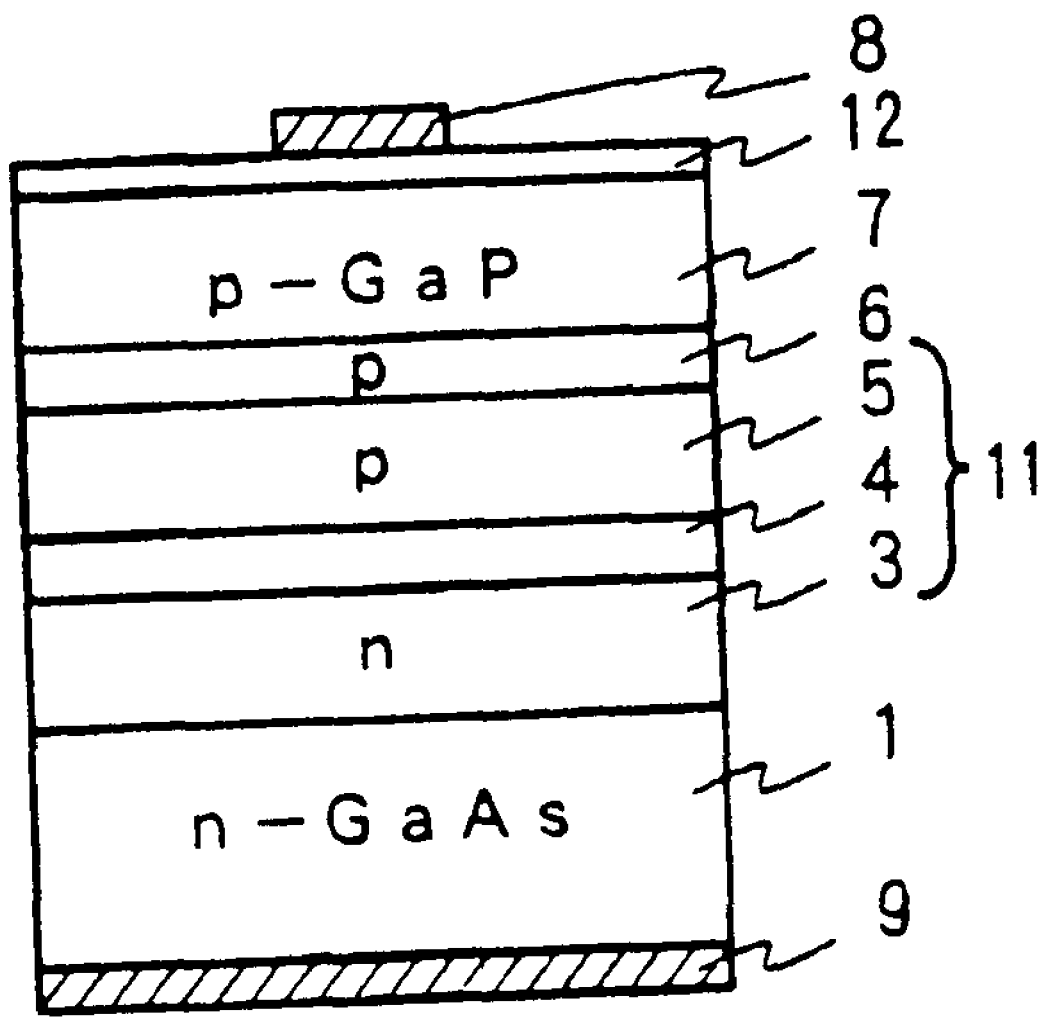

SEMICONDUCTOR LIGHT EMITTING DEVICE HAVING A STRUCTURE WHICH RELIEVES LATTICE MISMATCH

BACKGROUND OF THE INVENTION

This invention relates to light emitting devices formed by using an AlGaInP-based compound semiconductor material for emitting visible light. More particularly, this invention relates to a semiconductor light emitting device having a semiconductor crystal layers improved in film quality to enhance electric characteristics such as light emitting efficiency.

A conventional semiconductor light emitting device for emitting visible light has a light emitting layer forming portion formed by employing an AlGaInP-based compound semiconductor, as shown in FIG. 5. In FIG. 5, an n-type GaAs substrate has thereon a light emitting layer forming portion 29 of a doublehetero junction structure. That is, the light emitting layer forming portion 29 is formed by epitaxially growing, in order, an n-type cladding layer 22 of an n-type AlGaInP-based compound semiconductor material, an active layer 23 of a non-doped AlGaInP-based semiconductor material having a composition lower in bandgap energy than that of the cladding layer, and a p-type cladding layer 24 of a p-type AlGaInP-based semiconductor material. On the surface of the light emitting layer forming portion 29, a p-type GaP window layer (current diffusion layer) 25 is further epitaxially grown. A p-side electrode 27 and an n-side electrode 28 are respectively formed of an Au—Zn—Ni or Au—Ge—Ni alloy at main and back surfaces.

The light emitting device of this structure emits utilizable light through a surface of the semiconductor layers, i.e. the surface having the p-side electrode 27. Consequently, the p-side electrode 27 as a block to light has to be provided at an area as small as possible. On the other hand, since light emission is made by confining carriers within the active layer 23 sandwiched between the cladding layers 22, 24, electric currents have to be uniformly distributed over the entire light emitting layer. For this reason, the window layer 25 is provided for spreading the electric currents throughout an entire plane within the chip.

It is desired that this window layer 25 is formed so as to sufficiently diffuse electric currents and at the same time nonabsorbent of the light emitted from the active layer 23. There are some cases that a material GaP having a large bandgap energy is employed in order to increase spread of electric currents. There are other cases, as in an example of FIG. 6, that the window layer is formed by a composite layer having an AlGaAs-based compound semiconductor sublayer with high carrier concentration and a GaP sublayer with somewhat lower carrier concentration but large in bandgap energy so as to reduce light absorption.

In the conventional semiconductor light emitting devices as shown in FIGS. 5 and 6, lattice matching between the GaAs substrate and the AlGaInP-based compound semiconductor (lattice constant: 5.653 angstroms) is made through controlling a crystal mixture ratio of (AlGa) and In. Further, lattice matching is given also to an AlGaAs-based compound semiconductor. However, lattice matching is not given to between the AlGaInP-based compound semiconductor or AlGaAs-based compound semiconductor and the GaP material (lattice constant: 5.451 angstroms). Accordingly, there is a problem that the GaP window layer suffers deterioration in film quality and has an increased electric resistance to thereby increase operating voltage or weaken current diffusion, resulting in lowering in electric characteristics such as light emitting efficiency.

Meanwhile, in the semiconductor light emitting device structured as shown in FIG. 5, the window layer has to be formed at a high carrier concentration and an increased thickness in order to diffuse electric current. However, there is a limitation in increasing the carrier concentration by impurity doping. It is impossible to increase the carrier concentration to such a level as obtainable in metals. In order to spread the current supplied from the upper small electrode to the entire plane of the device chip before reaching the cladding layer, there is a necessity of increasing the thickness of the window layer to approximately 10–60 $\mu$m as in the conventional. Such a thick window layer requires a long time, approximately 12–20 hours, of epitaxial growth. Even if the layer thickness is achieved, it is difficult to diffuse electric current to a sufficient extent. Current distribution is uneven to cause deviated light emission with reduced light emitting efficiency. Further, the GaP window layer is not given lattice matching. Accordingly, if the thickness of the window layer is increased, the film quality thereof is deteriorated to further increase the series resistance, raising a problem of lowering electric characteristics such as increase in operating voltage and lowering in light emitting efficiency due to insufficient current diffusion.

Furthermore, although the GaP layer is large in bandgap energy, it absorbs the light emitted by the light emitting layer to a certain extent, and is not perfectly transparent for visible light.

It is therefore an object of the present invention to provide a semiconductor light emitting device having a light emitting layer formed of an AlGaInP-based compound semiconductor and a window layer formed of a material such as GaP having a large bandgap energy, which is improved in light emitting efficiency and electric characteristics without degrading the film quality of the window layer.

It is another object to provide a semiconductor light emitting device which is suppressed against light absorption by the window layer, enhancing the efficiency of light radiating outward the device.

It is further object of the present invention to provide a semiconductor light emitting device having a light emitting layer forming portion formed of an AlGaInP-based compound semiconductor and a window layer formed of GaP, which is capable of diffusing electric current sufficiently for enhancing light emitting efficiency while formed in a shortened growth time by reducing the thickness of the window layer.

SUMMARY OF THE INVENTION

According to the present invention, a semiconductor light emitting device, comprising: a substrate; a light emitting layer forming portion formed of an AlGaInP-based compound semiconductor and having an n-type layer and a p-type layer to form a light emitting layer on the substrate; a large bandgap energy semiconductor layer provided on a surface of the light emitting layer forming portion to constitute a window layer; a buffer layer interposed between the light emitting layer forming portion and the large bandgap energy semiconductor layer to relieve lattice mismatch of between the light emitting layer forming portion and the large bandgap energy semiconductor layer.

Here, the AlGaInP-based compound semiconductor is a material expressed by a formula $(Al_xGa_{1-x})_{0.51}In_{0.49}P$, where the value x is variable between 0 and 1. Note that the crystal mixture ratios of $(Al_xGa_{1-x})$ and In of 0.51 and 0.49 are a ratio lattice-matched to the substrate such as of GaAs on which the AlGaInP-based compound semiconductor is formed. The large bandgap energy semiconductor layer means a semiconductor layer through which the light emitted by the light emitting layer forming portion is less absorbed, and includes ones that somewhat absorbs the light. For example, a GaP layer may be employed as one example.

With this structure, the light emitting layer forming portion and the large bandgap energy semiconductor layer have no cumulating of distortions occuring therebetween due to a difference in their lattice constants. Since the distortions, in an interface, due to the difference of lattice constants are relaxed, the window layer has an improved film quality to improve electric characteristics for the light emitting device.

The buffer layer may be provided between the light emitting layer forming portion and a window layer in a structure that a large bandgap energy semiconductor layer for constituting a window layer is provided on the light emitting layer forming portion, or between a high carrier concentration semiconductor sublayer and a large bandgap energy semiconductor sublayer in a structure that the window layer is of a multilayered structure formed by the high carrier concentration semiconductor sublayer and the large bandgap energy semiconductor sublayer.

The buffer layer may be of a multilayered structure formed by a semiconductor sublayer lattice-matched to the light emitting layer forming portion and a large bandgap energy semiconductor sublayer, or by a semiconductor layer having an intermediate lattice constant such as a $(Al_xGa_{1-x})_{1-y}In_yP$ ($0 \leq x \leq 1$, $0 < y \leq 0.4$) compound semiconductor or a GaInP-based compound semiconductor. Where constituting the multilayered structure, the buffer layer has a film thickness 20–500 angstroms per sublayer and a total thickness of 1 $\mu$m or thinner, for the convenience of suppressing light absorption low while relaxing lattice distortions. Also, the GaInP-based compound semiconductor means a material having a variable crystal mixture ratio of Ga and P.

More specifically, the large bandgap energy semiconductor layer may be formed of GaP, the buffer layer being of a multilayered structure formed alternately by a GaP sublayer and an AlGaInP-based compound semiconductor sublayer of the light emitting layer forming portion on a side of the window layer. More specifically, the light emitting layer forming portion may be formed by a first conductivity-type cladding layer of an AlGaInP-based compound semiconductor, an active layer of an AlGaInP-based compound semiconductor having a composition lower in bandgap energy than the cladding layer, and a second conductivity-type cladding layer having a same composition as the first conductivity-type cladding layer, the buffer layer being formed of a same material as the second conductivity-type cladding layer and a GaP multilayered structure. In this structure, the buffer layer may employ a compound semiconductor $(Al_xGa_{1-x})_{1-y}In_yP$ ($0 \leq x \leq 1$, $0 < y \leq 0.4$), and the large bandgap energy semiconductor layer using GaP.

As a concrete structure that the window layer is formed by a high carrier concentration semiconductor layer and a large bandgap energy semiconductor layer, the high carrier concentration semiconductor layer may be an AlGaAs-based compound semiconductor layer or an AlGaInP-based compound semiconductor layer, the large bandgap energy semiconductor layer being a GaP layer, and the buffer layer being a GaInP-based compound semiconductor layer. Here, the AlGaAs-based compound semiconductor means a material having a variable crystal mixture ratio of Al and Ga. This is true for other compound semiconductor.

In the structures of the above embodiments, a current diffusion layer of a metal film may be formed over an entire surface of the window layer. This reduces the thickness of the window layer while the current diffusion layer serves to spread electric currents over a plane within a chip with high efficiency. Consequently, the process of epitaxial growth is shortened in time and the deterioration of the film quality is avoided, raising light emitting efficiency.

In another form of a semiconductor light emitting device according to the present invention, a semiconductor light emitting device, comprising: a substrate; a light emitting layer forming portion formed of an AlGaInP-based compound semiconductor and having an n-type layer and a p-type layer to form a light emitting layer on the substrate; a window layer provided on a side of a surface of the light emitting layer forming portion; the window layer being of a multilayered structure formed by a high carrier concentration semiconductor sublayer and a large bandgap energy semiconductor sublayer; and the large bandgap energy semiconductor sublayer being formed of a compound semiconductor $(Al_xGa_{1-x})_{1-z}In_zP$ ($0 \leq x \leq 1$, $0 \leq z < 0.49$). The high carrier concentration semiconductor sublayer may be formed of an AlGaAs-based compound semiconductor or an AlGaInP-based compound semiconductor.

By using the above material for the large bandgap energy layer, the same layer has a bandgap energy greater than that of the GaP layer, suppressing light absorption and raising light radiating efficiency.

A GaP layer may be provided on a side of a surface of the large bandgap energy semiconductor sublayer. The electric characteristic of contact with the p-side electrode is not lowered as compared to the conventional structure.

In further form of a semiconductor light emitting device according to the present invention, a semiconductor light emitting device, comprising: a substrate; a light emitting layer forming portion formed of an AlGaInP-based compound semiconductor and having an n-type layer and a p-type layer to form a light emitting layer on the substrate; a window layer provided on a side of a surface of the light emitting layer forming portion; an electrode provided in electrical connection with the window layer; and a current diffusion layer formed by a metal film between the electrode and the window layer, and over an entire surface of the window layer.

With this structure, the thickness of the window layer can be made very thin and the electric current can be sufficiently diffused over an entire surface in the chip. Consequently, it is possible to greatly reduce the time for growing the window layer. The series resistance can be reduced to lower the operating voltage. Further, the degradation in film quality due to the difference in lattice constant can be reduced to further improve the device characteristics.

The current diffusion layer may be formed by one or two or more metal layers and has a total thickness of 100 nm or thinner. This causes diffusion of electric current to enhance light emitting efficiency without absorption of the light emitted by the light emitting layer.

The current diffusion layer may be formed of at least one metal selected from a group consisting of Au, Zn, Ni, Ge, Ti, Al, Be, Si, Sb, Sn, an Au—Zn alloy, an Au—Sb alloy, an Au—Be alloy, an Au—Sn and an Au—Ge alloy. Also, the light emitting layer forming portion may be formed by a first conductivity-type cladding layer, for example, of an AlGaInP-based compound semiconductor, an active layer of an AlGaInP-based compound semiconductor having a composition lower in bandgap energy than the cladding layer, and a second conductivity-type cladding layer having a same composition as the first conductivity-type cladding layer.

This provides a light emitting device having a high light emitting efficiency.

For a fuller understanding of the nature and advantages of the invention, reference should be made to the ensuing detailed description taken in conjunction with the accompanying drawings.

DETAILED DESCRIPTION

Figure 1:
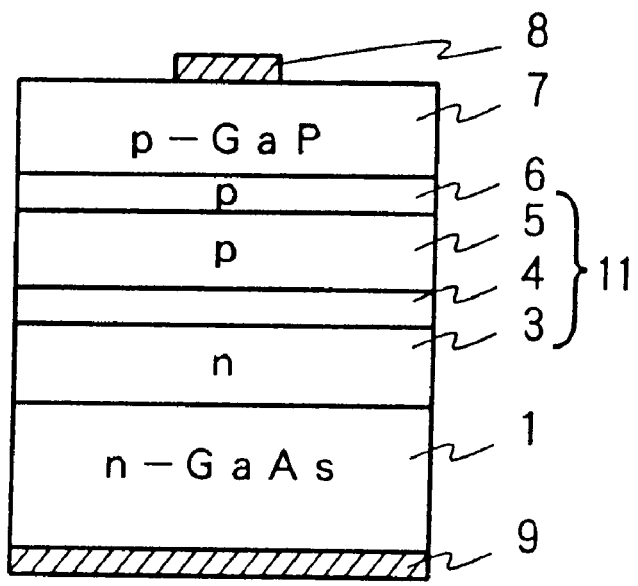
FIGS. 1(a) to 1(c) are sectional views of a semiconductor light emitting device according to one embodiment of the present invention.
Figure 1:
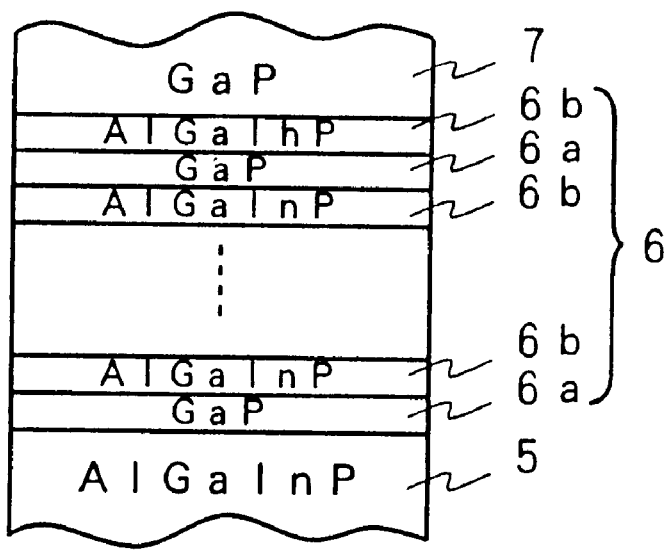

Referring to FIG. 1(a), there is shown a sectional view of a semiconductor light emitting device according to one embodiment of the present invention. The semiconductor light emitting device includes an n-type GaAs substrate 1 on which a light emitting layer forming portion 11 is formed by an AlGaInP-based compound semiconductor layers, providing therein a light emitting layer. A window layer 7 of a p-type GaP semiconductor layer, having a large bandgap energy, is formed on a surface of the light emitting layer forming portion 11 through a buffer layer 6. A p-side electrode 8 is formed on a surface of the window layer 7, while an n-side electrode 9 is provided on a backside of the GaAs substrate 1. In the present invention, the buffer layer 6 is interposed between the two layers different in lattice constant, i.e. the AlGaInP-based compound semiconductor layer and the large bandgap energy GaP layer, in order to relieve lattice mismatch due to the difference in lattice constant between these layers.

This buffer layer 6 is structured, as shown in FIG. 1(b), by a multilayered structure including a GaP sublayer 6a formed of a same material as the material of the window layer 7 and an AlGaInP-based compound semiconductor sublayer 6b formed in a same composition of that of a p-type cladding layer 5 formed as an uppermost layer of the light emitting layer forming portion 11. The GaP sublayer 6a and the AlGaInP-based compound semiconductor sublayer 6b each have a film thickness of approximately 20–500 angstroms so that they are overlaid one another by respective 5–100 sublayers, thereby forming a buffer layer 6 having a total thickness of approximately from 0.02–20 $\mu$m.

The light emitting layer forming portion 11 is formed of an AlGaInP-based compound semiconductor having a carrier concentration of approximately $1 \times 10^{17} - 1 \times 10^{19}$ cm$^{-3}$. The light emitting layer forming portion 11 is structured by an n-type cladding layer 3 having a layer thickness of approximately 0.1–2 $\mu$m, an active layer 4 formed of a non-doped AlGaInP-based compound semiconductor having such a composition that is lower in bandgap energy than that of the cladding layer to have a thickness of approximately 0.1–2 $\mu$m, and a p-type cladding layer 5 formed in a thickness of 0.1–2 $\mu$m of an AlGaInP-based compound semiconductor that is same in composition as that of the n-type cladding layer 5 but doped with Zn to a carrier concentration of approximately $1 \times 10^{16} - 1 \times 10^{19}$ cm$^{-3}$. Note that there are practical cases that a light emitting layer forming portion is provided through a not-shown buffer layer on a substrate. In such a case, the buffer layer may be formed in a thickness of 0.1–2 $\mu$m of an n-type GaAs having a carrier concentration of approximately $1 \times 10^{17} - 1 \times 10^{19}$ cm$^{-3}$.

The abovestated buffer layer 6 has, on the surface, the window layer 7 having a thickness of approximately 0.2–20 $\mu$m. On a surface of the window layer 7, the p-side electrode 8 is formed of an alloy of Au—Ti, Zn—Ni or the like. Meanwhile, the n-side electrode 9 is formed of an Au—Ge—Ni alloy or the like on the back surface of the GaAs substrate 1. Note that a contact layer, not shown, may be provided of GaAs having a thickness of 0.05–0.2 $\mu$m between the window layer 7 and the p-side electrode 8, which is doped with Zn to a carrier concentration of approximately $2 \times 10^{19}$ cm$^{-3}$.

To manufacture a semiconductor light emitting device constructed as above, a GaAs substrate 1, for example, of an n-type is placed within an MOCVD reactor. Reacting gasses of triethylegallium (hereinafter referred to as TEG) or trimethylegallium (hereinafter referred to as TMG), arsine (hereinafter referred to as AsH$_3$) and Se-dopant H$_2$Se are introduced together with a hydrogen (H$_2$) carrier gas of into the reactor so as to cause epitaxial growth on the substrate at a temperature of approximately 500–800° C. Thus, an n-type GaAs buffer layer (not shown) is formed to a thickness of approximately 0.1 $\mu$m that is doped with Se to a carrier concentration of approximately $1 \times 10^{18}$ cm$^{-3}$. Introducing phosphine (hereinafter referred to as PH$_3$) in place of AsH$_3$ and further trimethlealuminum (hereinafter referred to as TMA) and trimethyleindium (hereinafter refereed to as TMIn), an n-type cladding layer 3 is epitaxially grown of an n-type (Al$_{0.7}$Ga$_{0.3}$)$_{0.51}$In$_{0.49}$P having a carrier concentration of approximately $1 \times 10^{17} - 1 \times 10^{19}$ cm$^{-1}$, to a thickness of approximately 0.5 $\mu$m. By decreasing a TMA ratio to increase a TEG or TMG ratio of the reacting gas, an active layer 4 is formed of non-doped (Al$_{0.7}$Ga$_{0.3}$)$_{0.51}$In$_{0.49}$P to a thickness of approximately 0.5 $\mu$m. Introducing dimethylezinc (DMZn) as a Zn dopant gas in place of H$_2$Se to supply a similar reacting gas for the n-type cladding layer 3, a p-type cladding layer 5 is epitaxially grown of (Al$_{0.7}$Ga$_{0.3}$)$_{0.51}$In$_{0.49}$P to a carrier concentration of approximately $1 \times 10^{16} - 1 \times 10^{19}$ cm$^{-3}$, to a thickness of approximately 0.5 $\mu$m.

Then, the reacting gas is changed over at every 0.1–5 minutes between a combination of TEG, TMG and PH$_3$ and a combination of TMIn, TEG or TMG, TMA, and PH$_3$ while supplying the dopant gas DMZn, GaP layers 6a and (Al$_{0.7}$Ga$_{0.3}$)$_{0.51}$In$_{0.49}$P layers 6b are alternately formed so that respective layers are 5–100 in number each having a thickness of 20–200 angstroms. Thus, a buffer layer 6 is formed that has a total thickness of 0.1–1 $\mu$m. Then, the reacting gas is changed to TEG or TMG and PH$_3$ to continue a growth of GaP to thereby form a window layer 7 having a carrier concentration of approximately $1 \times 10^{16} - 1 \times 10^{19}$ cm$^{-3}$, to a thickness of approximately 0.3–20 $\mu$m. Further, a contact layer (not shown) is formed, as required, of GaAs having a carrier concentration of approximately $2 \times 10$ cm$^{-3}$ and a thickness of 0.05–0.2 $\mu$m on a surface of the window layer 7, by supplying TEG or TMG, AsH$_3$ and DMZn thereover.

The substrate having epitaxial layers thus grown is formed, at respective upper and back surfaces, with an upper (p-side) electrode 8 of an Au—Ti or Au—Zn—Ni alloy and a lower (n-side) electrode 9 of an Au—Ge—Ni alloy, so that it is subjected to dicing into chips.

According to the preset invention, the buffer layer 6 is interposed between the light emitting layer forming portion formed of AlGaInP-based compound semiconductor and the widow layer so that the buffer layer is formed by a multi-layered structured having the alternate GaP and AlGaInP-based layers each having a thickness as thin as approximately 20–500 angstroms. As stated before, the lattice constant is different between the GaP layer and the AlGaInP-based compound semiconductor layer. In this buffer layer 6, however, each sublayer is thin, i.e. approximately 20–500 angstroms so that one sublayer is replaced by an next sublayer before distortion or mismatch is cumulated so much due to the difference of their lattice constants. Consequently, the formed sublayers are free of cumulating of distortion, and accordingly the resulting buffer layer 6 is provided distortion-free without a problem of lattice mismatch due to difference in lattice constant. In this manner, the buffer layer 6 absorbs the lattice-constant difference and hence distortions between the window layer 7 of GaP and the p-type cladding layer 5 of an AlGaInP-based compound semiconductor. Meanwhile, the buffer layer 6 is formed by the same materials as the p-type cladding layer 5 and the window layer 7, and the GaP has large bandgap. Accordingly, almost no light absorption occurs. There is no reduction in carrier concentration.

The buffer layer 6 may be formed in a thickness of approximately 0.02–20 μm by employing a material having an intermediate lattice constant between those of the p-type cladding layer 5 and the window layer 7 as stated hereunder, instead of the multilayered structure with the alternate layers of the materials of the p-type cladding layer 5 and the window layer 7.

Figure 2:
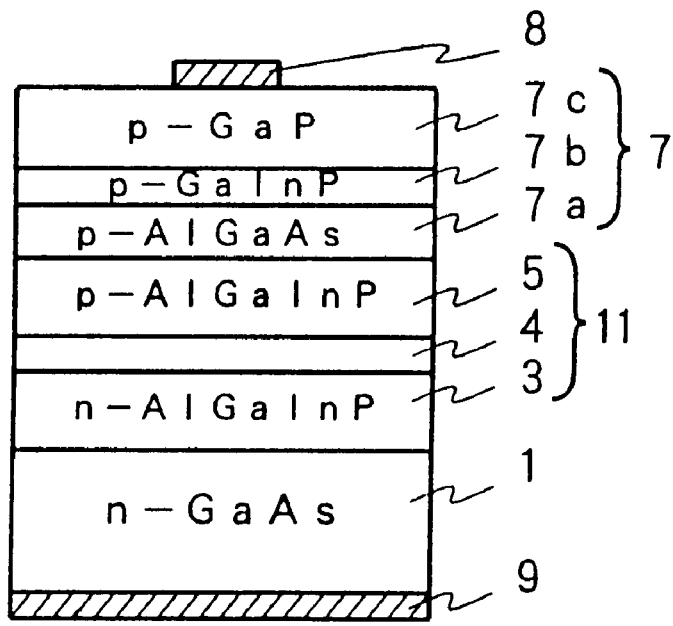
FIGS. 2(a) to 2(b) are sectional views of a semiconductor light emitting device according to another embodiment of the present invention.
Figure 2:
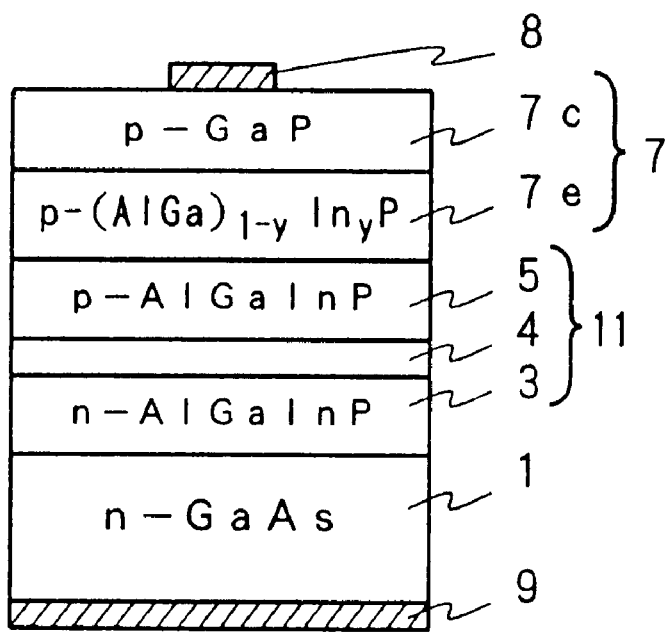

Referring to FIG. 2(*a*), there is demonstrated an embodiment having a window layer 7, on the light emitting layer forming portion 11, formed by a multilayered structure comprising a high carrier concentration semiconductor layer 7*a*, a buffer layer 7*b* and a large bandgap energy semiconductor layer 7*c*. The other layers, such as light emitting layer forming portion 11 and electrodes 8, 9 are the same as those of the above-stated embodiment. That is, where the light emitting semiconductor device has a window layer 7 including a high carrier concentration semiconductor layer 7*a* and a large bandgap energy semiconductor layer 7*c*, a ternary or higher system compound semiconductor such as the high carrier concentration semiconductor layer 7*a* is lattice-matched to the GaAs substrate. However, the large bandgap energy semiconductor layer 7*c* formed of a binary material GaP is difficult to attain lattice matching to the GaAs substrate, giving rise to degrading in film quality of the window layer 7 as stated before and worsening the light emission efficiency. To cope with this, this embodiment has a window layer 7 including a buffer layer 7*b* interposed between the high carrier concentration semiconductor layer 7*a* and the large bandgap energy semiconductor layer 7*c* in order to release distortion caused due to the difference of lattice constant.

The high carrier concentration layer 7*a* is formed of an AlGaAs-based compound semiconductor or an AlGaInP-based compound semiconductor, and has a carrier concentration of approximately $1 \times 10^{18}$–$1 \times 10^{20}$ cm$^{-3}$ and a thickness of approximately 1–5 μm. These AlGaAs-based and AlGaInP-based semiconductor materials can accept impurity doping to a high carrier concentration extent. Of these materials, the AlGaInP-based compound semiconductor is the same material as the cladding layer of the light emitting layer forming portion 11. However, the carrier concentration cannot be increased for the AlGaInP-based compound semiconductor material of the light emitting layer forming portion 11 due to light emission efficiency. Accordingly, the AlGaInP-based material of the window layer 7 is provided separately from the cladding layer of the light emitting layer forming portion 11. In such a case, the AlGaInP-based material of the window layer 7 may have a composition with an Al ratio higher than or equal to that of the cladding layer of the light emitting layer forming portion 11.

The larger bandgap energy semiconductor layer 7*c* may employ a GaP layer as conventional or a hereinafter-stated compound semiconductor material $(Al_xGa_{1-x})_{1-z}In_zP$ ($0 \leq x \leq 1$, $0 \leq z < 0.49$), and have a carrier concentration of approximately $1 \times 10^{16}$–$1 \times 10^{19}$ cm$^{-3}$ and a thickness of approximately 0.1–20 μm.

The buffer layer 7*b* may employ a material having a lattice constant intermediate between a lattice constant 5.653 angstroms of an AlGaAs-based material matched to that of the GaAs substrate, i.e. the high carrier concentration semiconductor layer 7*a*, and a lattice constant 5.451 angstroms of GaP layer, i.e. the large bandgap energy semiconductor layer 7*c*. For example, GaInP (lattice constant: 5.491 angstroms) may be used for forming the buffer layer 7*b* with a carrier concentration of $1 \times 10^{16}$–$1 \times 10^{19}$ cm$^{-3}$ and a thickness of approximately 0.02–20 μm. It is, however, possible to form the buffer layer 7*b*, for example, by alternately layering the high carrier concentration layer and the large bandgap energy layer, in a manner similar to the above-stated embodiment.

To manufacture a semiconductor light emitting device of this embodiment, the method stated in the above embodiment can be applied except for the window layer 7. The window layer 7 is formed, for example, by the following manner. Introducing DMZn and using a reacting gas of TEG or TMG, TMA and AsH$_3$, a p-type AlGaAs layer 7*a* is grown in a carrier concentration of approximately $1 \times 10^{17}$–$1 \times 10^{19}$ cm$^{-3}$, to a thickness of approximately 1–10 ‖m. Changing the reacting gas to TMIn, TEG or TMG, and PH$_3$, a p-type GaInP layer 7*b* is grown to a thickness of approximately 0.001–0.1 μm. The reacting gas is changed to TEG or TMG, and PH$_3$, a p-type GaP layer 7*c* is further grown to a thickness of approximately 0.001–0.1 μm.

In this embodiment, the window layer is formed by interposing the buffer layer, for example, of GaInP between the high carrier concentration semiconductor layer of the AlGaAs-based or AlGaInP-based compound semiconductor and the GaP large bandgap energy semiconductor layer. The GaInP layer has a lattice constant lies between those of the respective adjacent layers, and releases distortions due to the difference in lattice constant from these layers. As a result, a semiconductor light emitting device is provided with a high light-emission efficiency by relaxing the distortions occurring at the interface of the semiconductor layers without degradation in a film quality of the window layer, even for semiconductor light emitting devices having a window layer formed by a high carrier concentration semiconductor layer and a large bandgap energy semiconductor layer. This buffer layer has a bandgap energy and a carrier concentration that lie between those of the adjacent two layers and accordingly has no adverse effects upon emission of light.

Meanwhile, if the buffer layer 7*b* is formed by the multilayered structure as in the above-stated embodiment, the sublayers are as thin as 20–500 angstroms, one sublayer is turned into a next sublayer before cumulating distortions therein. Since the sublayers has no distortions due to the difference in lattice constant, the resulting buffer layer 7b is free of cumulating of distortions. In this manner, the difference in lattice constant is absorbed between the respective two layers adjacent the buffer layer 7b, i.e. between the GaP large bandgap energy semiconductor layer 7c and the high carrier concentration semiconductor layer 7a such as of an AlGaAs-based compound semiconductor, giving rise to no distortions between these layers. Meanwhile, this buffer layer 7b is formed of the same material as the high carrier concentration semiconductor layer 7a and the large bandgap energy semiconductor layer 7c, wherein the material GaP is large in bandgap energy. Accordingly, there is almost no absorption of light and no reduction of carrier concentration.

It is known that the lattice constant of the AlGaInP-based compound semiconductor used for the above high carrier concentration semiconductor layer decreases with decrease in the content of In thereof. For example, for a material $(Al_xGa_{1-x})_{1-y}In_yP$ ($0 \leq x \leq 1$, $0 < y \leq 0.4$), the lattice constant is 5.6 angstroms when y is 0.4. This lattice constant is smaller than the lattice constant 5.653 angstroms of the light emitting layer forming portion, approximating to that of the GaP layer. Therefore, if the material $(Al_xGa_{1-x})_{1-y}In_yP$ ($0 \leq x \leq 1$, $0 < y \leq 0.4$) is employed for the buffer layer 7e having an intermediate lattice constant as shown in FIG. 2(b), the resulting layer serves both as the high carrier concentration semiconductor layer and the buffer layer. Incidentally, In FIG. 2(b), other portions are similar to those of FIG. 2(a) and same reference characters are used, omitting explanations thereof.

Figure 3:
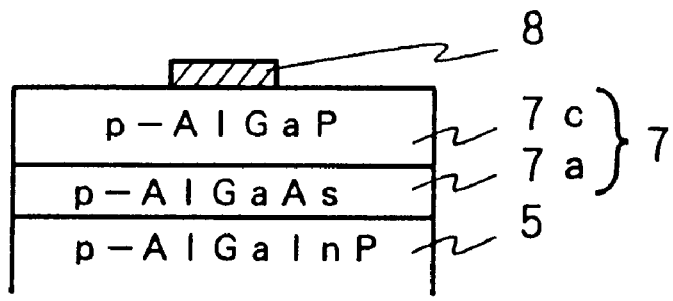
FIGS. 3(a) to 3(b) are partial sectional views of a semiconductor light emitting device according to another embodiment of the present invention.
Figure 3:
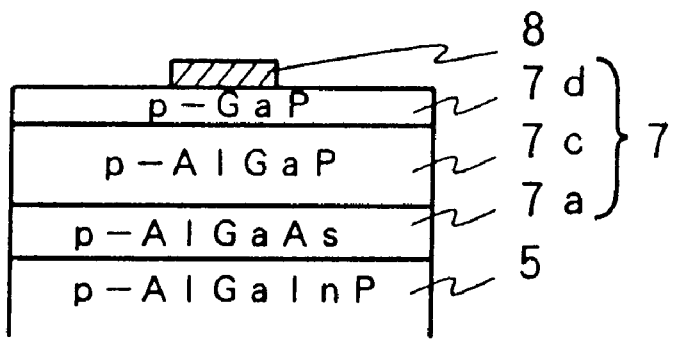

Referring to FIGS. 3(a)–3(b), there are shown sectional views of a window layer 7 and its vicinity for explaining a semiconductor light emitting device according to another embodiment of the present invention. This embodiment employs a material having higher bandgap energy than that of GaP, in order to further reduce absorption of light by the window layer and enhance the light radiation efficiency, i.e. the ratio in amount of the light radiated to an outside. As shown in FIG. 3(a), the large bandgap energy semiconductor layer 7c is formed of an AlGaP-based compound semiconductor. The semiconductor layer 7c may alternatively formed of a compound semiconductor $(Al_xGa_{1-x})_{1-z}In_zP$ ($0 \leq x \leq 1$, $0 \leq z < 0.49$) having a decreased In content than a value (0.49) matched to the GaAs substrate in order to increase the bandgap energy. These semiconductor materials have higher bandgap energy than the GaP material for the above-stated embodiment, further suppressing absorption of light. Since the large bandgap energy semiconductor materials cannot increase the carrier concentration to a sufficient extent, a semiconductor layer 7a having an increased carrier concentration is preferably placed on a side of the light emitting layer forming portion 11. This high carrier concentration semiconductor layer 7a may employ an AlaGaAs-based compound semiconductor or an AlGaInP-based compound semiconductor having an increased carrier concentration as in the above-stated embodiment. Note that a buffer layer, though omittedly shown in FIG. 3(a), may preferably be interposed between the large bandgap energy layer and the high carrier concentration layer as in the FIG. 2(a) embodiment in order to relax a lattice mismatch.

Referring to FIG. 3(b), a GaP layer 7d, is provided on a surface of the large bandgap energy layer 7c, wherein the GaP layer 7d is smaller in bandgap energy than the same layer 7c but has a reduced electric resistance. The provision of this layer is to reduce electric contact resistance with the p-side electrode 8, giving an advantage of improving an electric characteristic.

Figure 4:
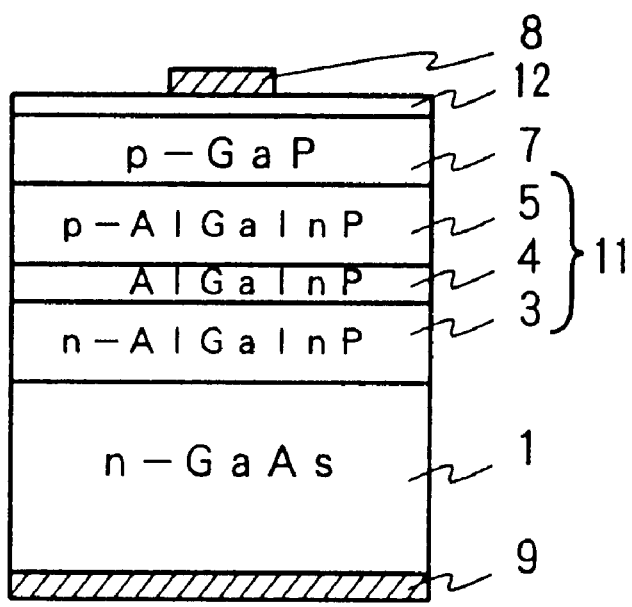
FIG. 4 is a sectional view of a semiconductor light emitting device according to another embodiment of the present invention.
Figure 5:
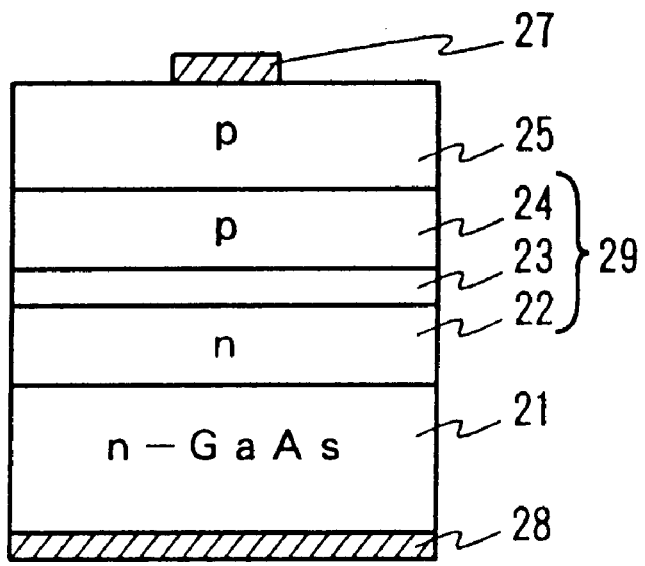
FIG. 5 and FIG. 6 are sectional views of conventional semiconductor light emitting devices.
Figure 6:
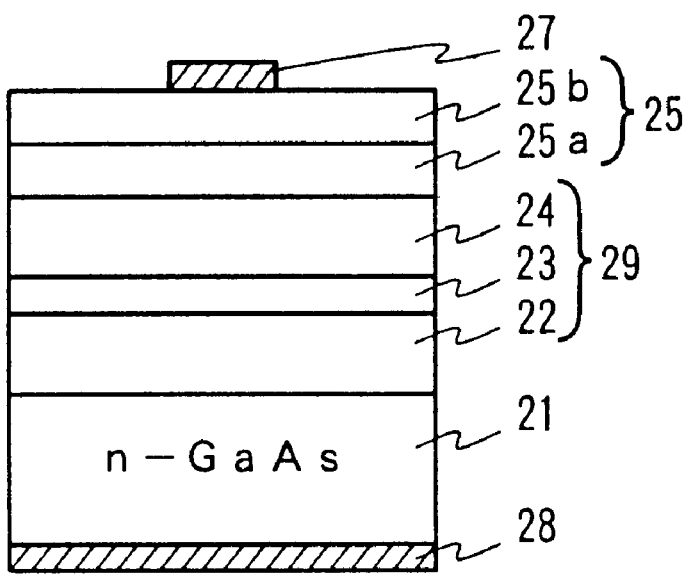

Referring to FIG. 4, there is shown another embodiment of a semiconductor light emitting device of the present invention. In this embodiment, a light emitting layer forming portion 11 is formed of an AlGaInP-based compound semiconductor so as to provide a light emitting layer on an n-type GaAs substrate 1. A p-type window layer 7 is formed on the light emitting layer forming portion 11 to a thickness of approximately 0.3–5 μm. A current diffusion layer 12 is formed of Au, an Au—Ni alloy, or the like over an entire surface of the window layer 7 to a thickness of approximately 1–100 nm. This embodiment is characterized that a p-side electrode 8 is formed through the current diffusion layer 12 on the window layer 7. Incidentally, the GaAs substrate 1 is formed at a back surface with an n-side electrode 9 similarly to the above-stated embodiments. That is, this embodiment has the thin p-type window layer 7 formed thereon of GaP and the current diffusion layer 12 formed by a very thin metal film.

The current diffusion layer 12 may be formed of a metal, such as Ni, Ge, Zn, Ti, Al, Be, Si, Sb or Sn, or an alloy, such as Au—Zn, Au—Sb, Au—Be, Au—Sn or Au—Ge, instead of Au or an Au—Ni alloy. These metals or alloys are easy to provide an ohmic contact with the GaP layer, and they are a light-transmissible material. The current diffusion layer 12 may be a composite layer formed by two or more layers of them. The current diffusion layer 12 is provided in a thickness of approximately 1–100 nm, preferably approximately 2–10 nm. The metal or alloy layer can be formed by vacuum evaporation of a metal or metals in a brief time of approximately 0.1–5 minutes and sintering at a temperature of approximately 100–700° C. for 0.1–10 minutes. To form an alloy metal layer, two or more metals are evaporated and then sintered. Where forming a composite metal layer, two or more metals are evaporated in order and sintered.

The window layer 7 is formed to a high carrier concentration such that it is jointed by ohmic contact with the current diffusion layer 12 thin for sufficient light transmission. Since the diffusion of current is made by the current diffusion layer 12, the window layer 7 is satisfactorily formed in a thickness of approximately 1 μm instead of a conventionally thick value of 10–60 μm. This in turn shorten the growth time for the window layer 7 to 2–3 hours from conventional 12–20 hours. In the meanwhile, the current diffusion layer 12 can be provided by processing many wafers in batch, further shorten the manufacture time per chip. Incidentally, other elements such as the light emitting layer forming portion 11 and electrodes 8, 9 are similar to the above embodiment.

To manufacture a semiconductor light emitting device of this embodiment, the processes up to the light emitting layer forming portion 11 are the same as those of the above embodiment. However, after forming the light emitting layer forming portion 11, the reacting gas is changed to TEG or TMG and $PH_3$ while supplying DMZn, to grow a GaP layer, thus providing a window layer 7 to a carrier concentration of approximately $1 \times 10^{16} – 1 \times 10^{19}$ cm$^{-3}$ and a thickness of approximately 0.1–5 μm.

Then, the wafer thus processed is placed in a vacuum evaporation apparatus to form Ni and Au layers each to a thickness of approximately 1–20 nm, followed by sintering at a temperature of 100–400° C. for 0.1– 10 minutes. Thus, an Au—Ni alloy current diffusion layer 12 is formed to a thickness of approximately 0.2–40 nm. On a surface of this layer, an upper electrode (p-side electrode) 8 is formed by vacuum evaporating and patterning an Au—Ti alloy or Au—Zn—Ni alloy. A lower electrode (n-side electrode) 9 is similarly formed of an Au—Ge—Ni alloy on a backside of the wafer. The wafer thus processed is divided by dicing into chips.

According to this embodiment, the light emitting layer forming portion 11 formed of an AlGaInP-based compound semiconductor has thereon a thin GaP window layer on the surface of which a light-transmitting thin metal layer is provided as the current diffusion layer. This metal layer has a low electric resistance, and diffuse an electric current despite formed thin. Meanwhile, the current diffusion layer is so thin, i.e. 100 nm or less, that it is substantially free from light absorption or reflection. It is therefore possible to diffuse an electric current over an entire plane of the light-emitting chip to cause light emission in the light emitting layer forming portion. The light is allowed to radiate and transmitted through a chip surface. Therefore, the light emitting chip provides light radiation through over entire surfaces with enhanced radiating efficiency.

In this embodiment, since an electric current is sufficiently diffused through the current diffusion layer, there is no necessity of forming the window layer excessively thick. Therefore, it is possible to shorten the growth time for the semiconductor layers and relieve the degradation of film quality due to the difference in lattice constant between the layers. Further, the thin window layer reduces series resistance to lower the operating voltage, providing a thin-formed light emitting device.

In this embodiment the window layer is formed of GaP. However, it is possible to use other large bandgap energy semiconductors such as an AlGaP-based compound semiconductor and an $(Al_xGa_{1-x})_{1-z}In_zP$ ($0 \leq x \leq 1$, $0 \leq z < 0.49$) compound semiconductor. It is further preferred that a buffer layer as stated before be interposed between the large bandgap energy semiconductor layer and the light emitting layer forming portion. Such an arrangement is shown in FIG. 1(c).

Incidentally, the above embodiment were formed by a doublehetero junction structure having a light emitting layer forming portion 11 having an active layer 4 sandwiched by cladding layers 3, 5 such that the material, e.g. the Al crystal mixture ratio, is different between the active layer 4 and the cladding layer 3, 5 so as to confine carriers or light within the active layer 4 serving as a light emitting layer, Alternatively, the structure may have a pn junction forming a light emitting layer without using the active layer 4.

Although the above embodiments were exemplified by using detailed materials for the semiconductor layers with particular thickness and carrier concentrations, the present invention is not limited to these embodiments.

In the preset invention, there occurs no internal distortion due to mismatch in lattice constant between the light emitting layer forming portion and the large bandgap semiconductor layer of the window layer. It is therefore possible to provide a window layer having a large bandgap energy GaP. The resulting semiconductor light emitting device can diffuse electric currents to a sufficient extent without almost no light absorption, thus offering high light-emitting efficiency with high brightness.

Where the window layer is structured by a high carrier concentration semiconductor sublayer and a large bandgap energy semiconductor sublayer for the window layer, there occur no internal distortions due to lattice-constant mismatch between these sublayers. With this structure, the resulting light emitting device has no distortions at an interface of the semiconductor sublayers while satisfying high carrier concentration and large bandgap energy characteristics, offering a high-quality structure and high light-emitting efficiency.

If the large bandgap energy semiconductor layer is formed by an AlGaP-based compound semiconductor such as $(Al_xGa_{1-x})_{1-z}In_zP$ ($0 \leq x \leq 1$, $0 \leq z < 0.49$), the resulting layer is lesser in light absorption than GaP, further enhancing the light emitting efficiency.

Further, where a large bandgap energy GaP window layer is provided on the AlGaInP-based compound semiconductor light emitting layer forming portion, an electric current is sufficiently diffused to provide a light emitting device with high light-emitting efficiency and high brightness. Further, since the window layer can be formed thin, manufacture cost can be reduced to lower operating voltage.

Although preferred embodiments have been described in some detail, it is to be understood that certain changes can be made by those skilled in the art without departing from the spirit and scope of the invention as defined by the appended claims.

What is claimed is:

1. A semiconductor light emitting device, comprising:
   a substrate;
   a light emitting layer forming portion formed of an AlGaInP-based compound semiconductor and having an n-type layer and a p-type layer, said light emitting layer forming portion being formed on said substrate;
   a window layer formed of a large bandgap energy semiconductor layer;
   a current diffusion layer of a metal film formed over an entire surface of said window layer; and
   an intermediate lattice constant layer having a lattice constant which is intermediate a lattice constant of said light emitting layer forming portion and a lattice constant of said large bandgap energy semiconductor layer, said intermediate lattice constant layer being interposed between said light emitting layer forming portion and said large bandgap energy semiconductor layer to relieve lattice mismatch between said light emitting layer forming portion and said large bandgap energy semiconductor layer.

2. A semiconductor light emitting device according to claim 1, wherein said current diffusion layer is formed of at least one metal selected from a group consisting of Au, Zn, Ni, Ge, Ti, Al, Be, Si, Sb, Sn, an Au—Zn alloy, an Au—Sb alloy, an Au—Be alloy, an Au—Sn alloy and an Au—Ge alloy.

3. A semiconductor light emitting device, comprising:
   a substrate;
   a light emitting layer forming portion formed of an AlGaInP-based compound semiconductor and having an n-type layer and a p-type layer to form a light emitting region on said substrate;
   a window layer provided on a side of a surface of said light emitting layer forming portion; said window layer being of a multilayered structure formed by a high carrier concentration semiconductor sublayer and a large bandgap energy semiconductor sublayer; and
   said large bandgap energy semiconductor sublayer being formed of a compound semiconductor $(Al_xGa_{1-x})_{1-z}In_zP$ ($0 \leq x \leq 1$, $0 < z \leq 0.49$).

4. A semiconductor light emitting device according to claim 3, wherein said high carrier concentration semiconductor sublayer is formed of an AlGaAs-based compound semiconductor or an AlGaInP-based compound semiconductor.

5. A semiconductor light emitting device according to claim 3, wherein a GaP layer is provided on a side of a surface of said large bandgap energy semiconductor sublayer.

6. A semiconductor light emitting device, comprising:

a substrate;

a light emitting layer forming portion formed of an AlGaInP-based compound semiconductor and having an n-type layer and a p-type layer to form a light emitting region on said substrate;

a window layer provided on a side of a surface of said light emitting layer forming portion;

an electrode provided in electrical connection with said window layer; and a current diffusion layer formed by a metal film between said electrode and said window layer, and over an entire surface of said window layer.

7. A semiconductor light emitting device according to claim 6, wherein said current diffusion layer is formed by one or two or more metal layers and has a total thickness of 100 nm or thinner.

8. A semiconductor light emitting device according to claim 6, wherein said current diffusion layer is formed of at least one metal selected from a group consisting of Au, Zn, Ni, Ge, Ti, Al, Be, Si, Sb, Sn, an Au—Zn alloy, an Au—Sb alloy, an Au—Be alloy, an Au—Sn alloy, and an Au—Ge alloy.

9. A semiconductor light emitting device according to claim 6, wherein said light emitting layer forming portion is formed by a first conductivity-type cladding layer of an AlGaInP-based compound semiconductor, an active layer of an AlGaInP-based compound semiconductor having a composition lower in bandgap energy than said cladding layer, and a second conductivity-type cladding layer having a same composition as said second conductivity-type cladding layer.

* * * * *